United States Patent
Kuo et al.

(10) Patent No.: US 10,847,429 B1
(45) Date of Patent: Nov. 24, 2020

(54) METHOD OF DETECTING PHOTORESIST SCUM, METHOD OF FORMING SEMICONDUCTOR PACKAGE AND PHOTORESIST SCUM DETECTION APPARATUS

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Chih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/655,240

(22) Filed: Oct. 17, 2019

(51) Int. Cl.
| | |
|---|---|
| H01L 21/66 | (2006.01) |
| H01L 21/033 | (2006.01) |
| H01L 21/311 | (2006.01) |
| H01L 21/027 | (2006.01) |
| H01L 21/02 | (2006.01) |

(52) U.S. Cl.
CPC ........ *H01L 22/12* (2013.01); *H01L 21/02063* (2013.01); *H01L 21/02071* (2013.01); *H01L 21/0274* (2013.01); *H01L 21/0337* (2013.01); *H01L 21/31138* (2013.01); *H01L 21/02057* (2013.01)

(58) Field of Classification Search
None
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0123161 A1* | 9/2002 | Ushiki | G01N 21/9501 438/14 |
| 2002/0148975 A1* | 10/2002 | Kimba | H01J 37/073 250/492.1 |
| 2011/0242510 A1* | 10/2011 | Nagaike | H01J 37/023 355/27 |
| 2014/0256138 A1* | 9/2014 | Chen | H01L 21/0209 438/702 |
| 2017/0194217 A1* | 7/2017 | Yen | G01N 21/55 |

\* cited by examiner

*Primary Examiner* — Steven B Gauthier
(74) *Attorney, Agent, or Firm* — JCIPRNET

(57) ABSTRACT

Provided is a method of detecting photoresist scums and photoresist residues. A carrier is provided. The carrier has a photoresist layer with opening patterns therein. A plasma etching process is performed to the opening patterns of the photoresist layer. Charges are injected to the opening patterns of the photoresist layer. Whether a photoresist scum or residue is present in at least one of the opening patterns is detected.

12 Claims, 16 Drawing Sheets

METHOD OF DETECTING PHOTORESIST SCUM, METHOD OF FORMING SEMICONDUCTOR PACKAGE AND PHOTORESIST SCUM DETECTION APPARATUS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreasing geometry sizes may lead to various manufacturing difficulties. For example, a photoresist layer is commonly used to pattern a layer in semiconductor processes. However, as the device size becomes smaller and smaller, a photoresist scum usually occurs, which may degrade the semiconductor device performance or even lead to a device failure.

DETAILED DESCRIPTION

Figure 1:
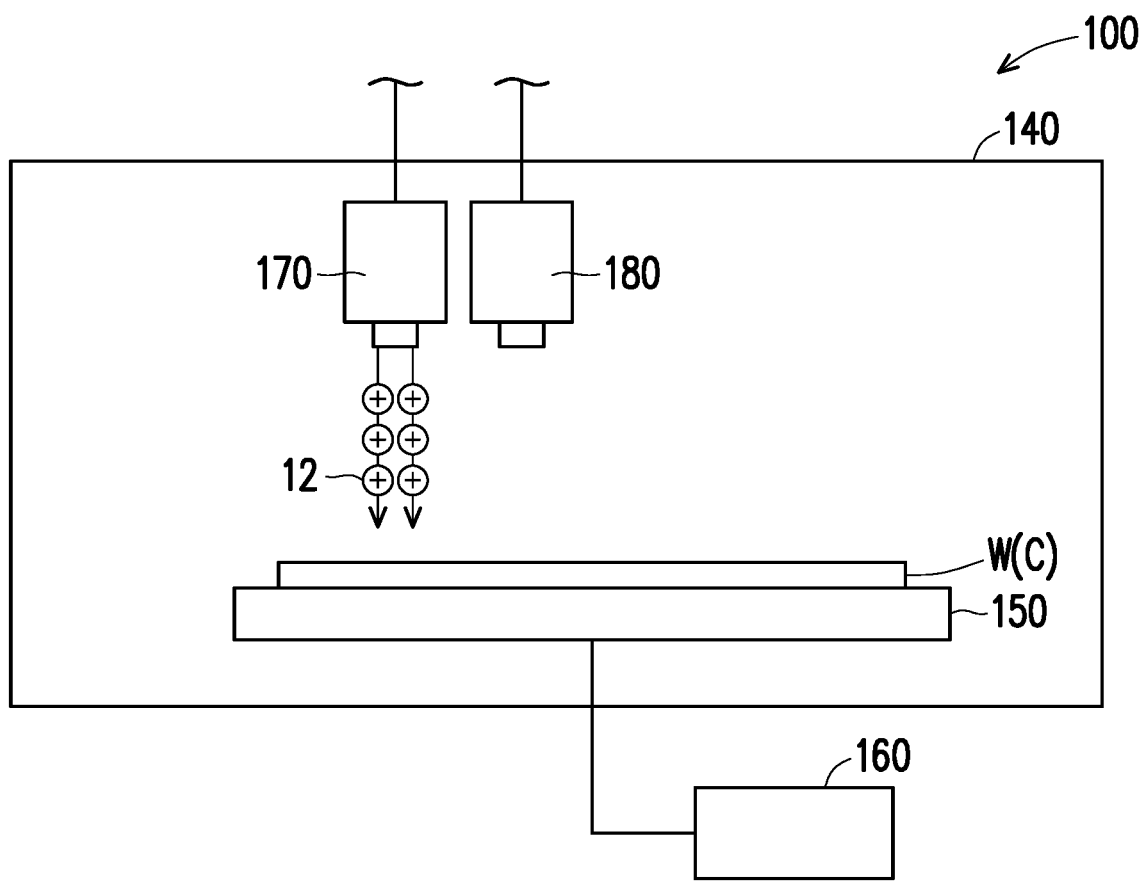
FIG. 1 is a schematic cross-sectional view of one embodiment of a photoresist scum detection apparatus in implementation of the present disclosure.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the device size becomes smaller and smaller, a photoresist scum usually occurs, which may degrade the semiconductor device performance or even lead to a device failure. Such photoresist scum is not easy to be detected by the conventional scanning electron microscope (SEM) apparatus or KLA-Tencor Corporation apparatus, because it is too thin (and transparent) to be detected. Accordingly, the present disclosure provides a novel method of detecting a photoresist scum. In some embodiments, the method includes injecting charges to a photoresist layer, detecting whether a photoresist scum is present in the photoresist layer, and removing the charges from the photoresist layer.

FIG. 1 is a schematic cross-sectional view of one embodiment of a photoresist scum detection apparatus in implementation of the present disclosure.

Referring to FIG. 1, a photoresist scum detection apparatus 100 may be used to check a photoresist scum at various steps in integrated circuit manufacturing. For example, photoresist scum inspections may be made at various stages including following a plasma etching process, referred to as after etch inspection (AEI), and following a photoresist stripping process, referred to as after stripping inspection (ASI).

In some embodiments, the photoresist scum detection apparatus 100 includes a housing 140 which contains a stage unit 150. The stage unit 150 is configured to support a wafer W (or carrier C). In some embodiments, the wafer W (or carrier C) has a photoresist layer with opening patterns therein. In some embodiments, a heater element 160 may be embedded in the stage unit 150 for heating the wafer W (or carrier C) supported on the stage unit 150.

The photoresist scum detection apparatus 100 further includes a charge injection unit 170 and a surface potential detection unit 180. The charge injection unit 170 is configured to inject charges 12 (or ions) to the opening patterns of the photoresist layer. In some embodiments, the charge injection unit 170 is configured to inject positive charges. The positive charges include $H^+$, $(H_2O)_nH^+$ or the like. However, the disclosure is not limited thereto. In some embodiments, the charge injection unit 170 is configured to inject negative charges. The negative charges include $CO_3^{-2}$ or the like.

In some embodiments, the surface potential detection unit 180 is configured to detect whether a photoresist scum is present within at least one of the opening patterns of the photoresist layer. Specifically, the surface potential detection unit 180 is configured to measure a surface potential of at least one of the opening patterns of the photoresist layer at two different time points and then calculate a surface potential difference of the opening pattern.

In some embodiments, the surface potential of at least one of the opening patterns of the photoresist layer is measured continuously by the surface potential detection unit 180, and the surface potential difference of the opening pattern is calculated by subtracting the second surface potential V2 at the final time point T2 from the first surface potential V1 at the initial time point T1. In some embodiments, the time period from the initial time point T1 to the final time point T2 is about 30 seconds. However, the disclosure is not limited thereto. In some embodiments, the time period for measurement may be less than or greater than 30 seconds.

In the disclosure, the charges 12 from the charge injection unit 170 accumulate more in the thicker photoresist scum location (e.g., edge corner or bottom within the opening pattern of the photoresist layer), while accumulate less in the thinner photoresist scum location. In some embodiments, the charges from the charge injection unit 170 almost disappear in the photoresist scum free region. Therefore, the surface potential difference between two different time points is less in the thicker photoresist scum location wherein the charges are trapped. On the contrary, the surface potential difference between two different time points is more in the thinner photoresist scum location wherein the charges disappear quickly through electron tunneling effect.

In the photoresist scum detection apparatus 100, the charge injection unit 170 and the surface potential detection unit 180 are arranged side by side.

In some embodiments, the charge injection unit 170 and the surface potential detection unit 180 are configured to correspond to a die region of a wafer (or carrier).

Figure 2:
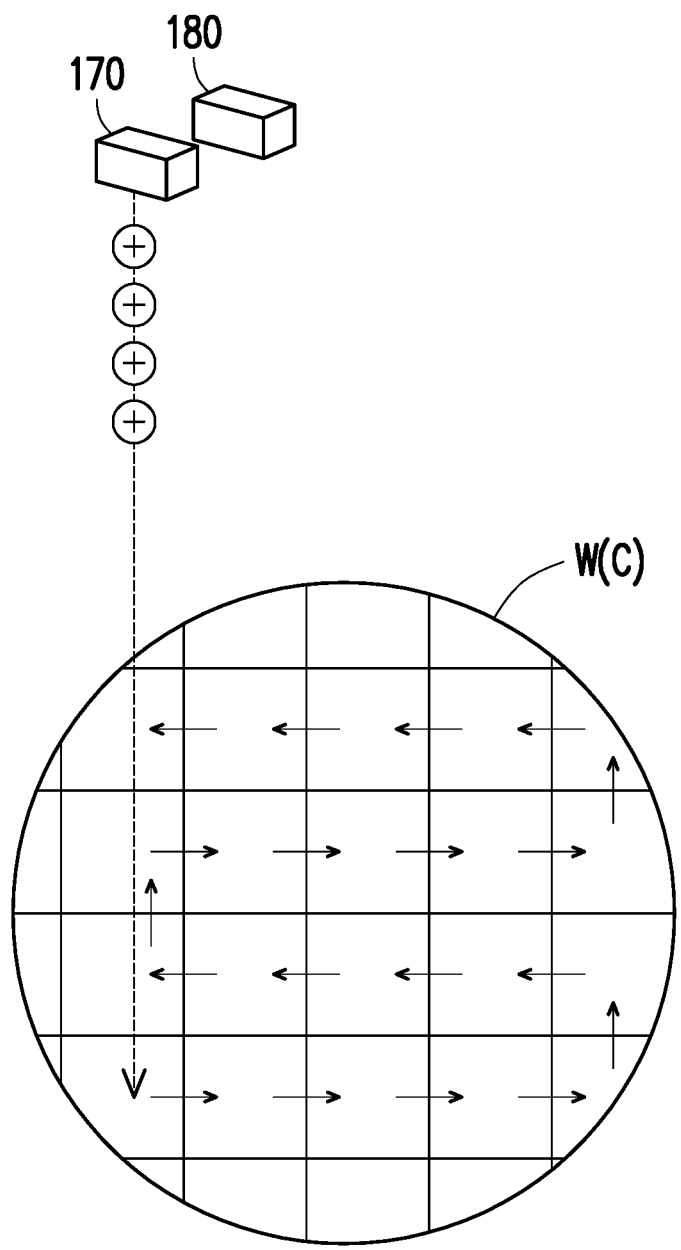
FIG. 2 is a plan view showing a routing method for a photoresist scum check in accordance with some embodiments.

FIG. 2 is a plan view showing a routing method for a photoresist scum check in accordance with some embodiments. Specifically, as shown in FIG. 2, in a plan view, the wafer W (or carrier C) is moved, shot by shot, in a first routing sequence. The wafer W (or carrier C) is moved by a wafer chuck moving element or motor (not shown) of the photoresist scum detection apparatus 100. In an embodiment, a first predetermined program is input, by using a computer, to the photoresist scum detection apparatus to initiate the first routing sequence. The first predetermined program divides the wafer W (or carrier C) into a plurality of shots, and removes the wafer W (or carrier C), shot by shot, along the arrow direction. In some embodiments, each shot is measured continuously for about 30 seconds and the surface potential difference of the shot is calculated by subtracting the final surface potential from the initial surface potential.

In some embodiments, the charge injection unit 170 and the surface potential detection unit 180 are configured to correspond to multiple die regions of the a wafer (or carrier).

Figure 3:
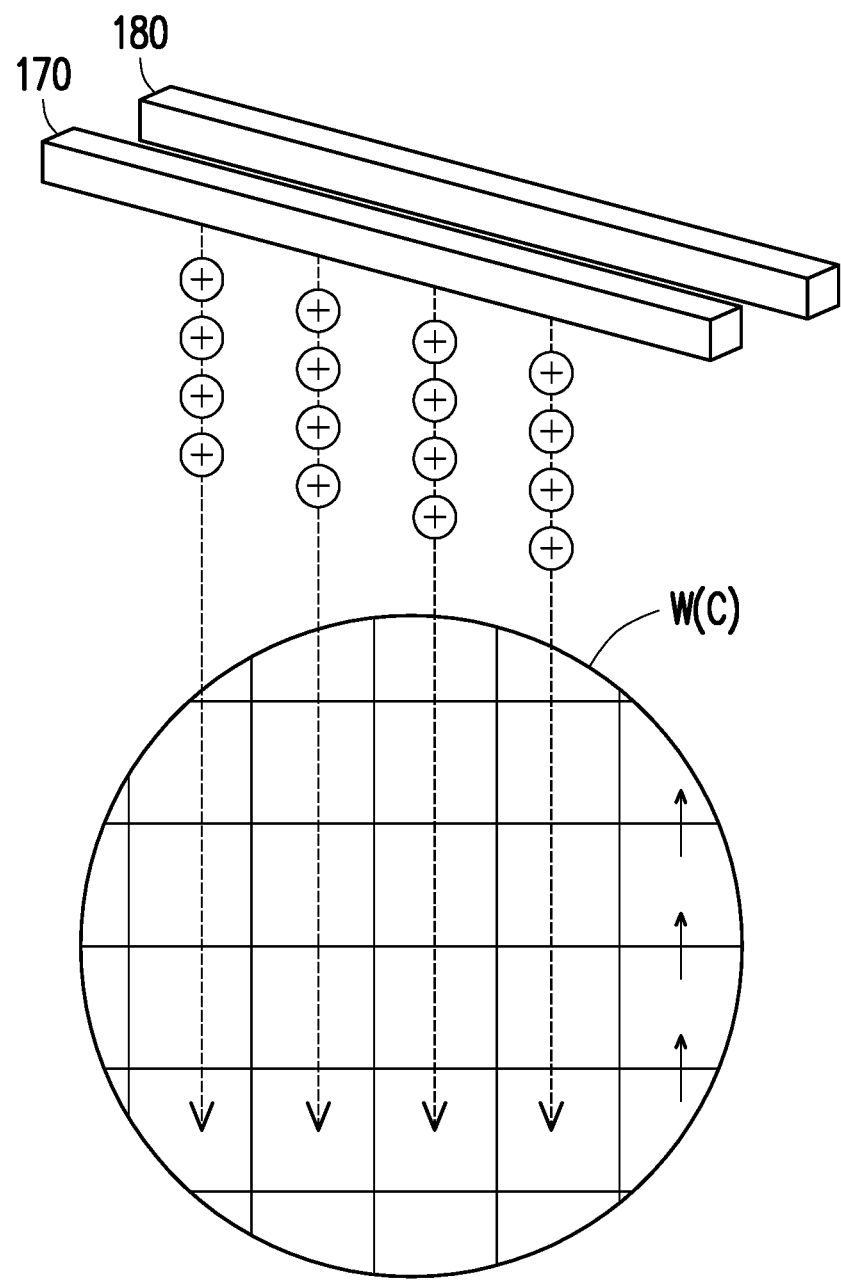
FIG. 3 is a plan view showing a routing method for a photoresist scum check in accordance with alternative embodiments.

FIG. 3 is a plan view showing a routing method for a photoresist scum check in accordance with alternative embodiments. Specifically, as shown in FIG. 3, in a plan view, the wafer W (or carrier C) is moved, row by row, in a second routing sequence. The wafer W (or carrier C) is moved by a wafer chuck moving element or motor (not shown) of the photoresist scum detection apparatus 100. In an embodiment, a second predetermined program is input, by using a computer, to the photoresist scum detection apparatus 100 to initiate the second routing sequence. The predetermined program divides the wafer W (or carrier C) into a plurality of rows, and removes the wafer W (or carrier C), row by row, along the arrow direction. In some embodiments, each row is measured continuously for about 30 seconds and the surface potential difference of each shot of the row is calculated by subtracting the final surface potential from the initial surface potential.

The surface potential difference of each shot is then compared with a predetermined value, so as to determine whether a photoresist scum is present in an opening patterns of the photoresist layer or not. Specifically, no photoresist scum is present within the opening pattern of the photoresist layer when the surface potential difference is equal to or greater than the predetermined value, and some photoresist scum is present within the opening pattern of the photoresist layer when the surface potential difference is less than the predetermined value. Herein, the term "no photoresist scum" indicates the case of photoresist scum free or the case including minimal photoresist scum which may not degrade the semiconductor device performance.

Upon the photoresist scum check, the charges are removed by heating the wafer W (or carrier C) with the heating element 160. The heating operation is performed with an oven or a hot plate. In some embodiments, the heating temperature ranges from about 40° C. to 100° C., and the heating time is about 1 to 2 minutes. In some embodiments, the heating temperature can be, for example but is not limited to, about 50° C., 60° C., 70° C., 80° C., 90° C., including any range between any two of the preceding values. In some embodiments, the heating temperature is such as to effectively remove the charges. The heating time can be adjusted upon the requirements, until the charges are completely removed.

Figure 4A:
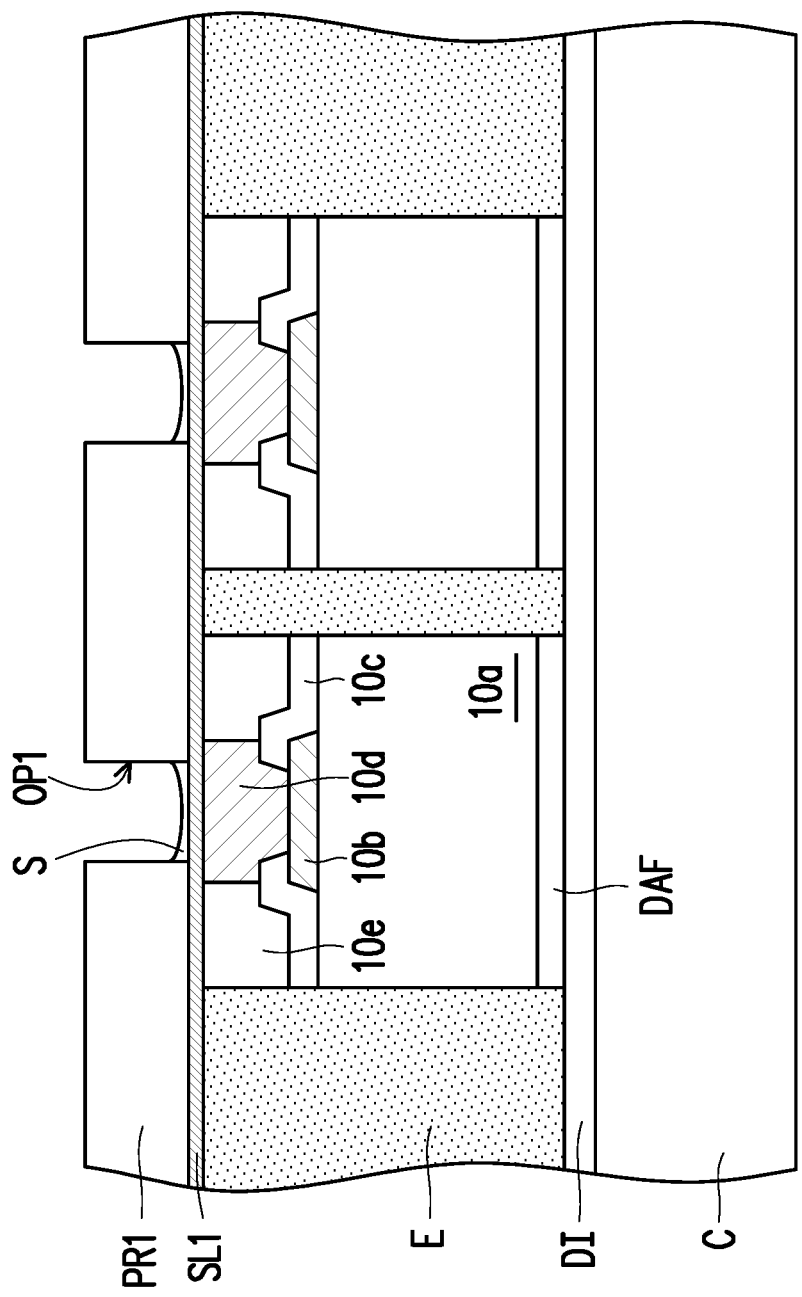
FIG. 4A to FIG. 4J are cross-sectional views showing a method of forming a semiconductor package in accordance with some embodiments.
Figure 4B:
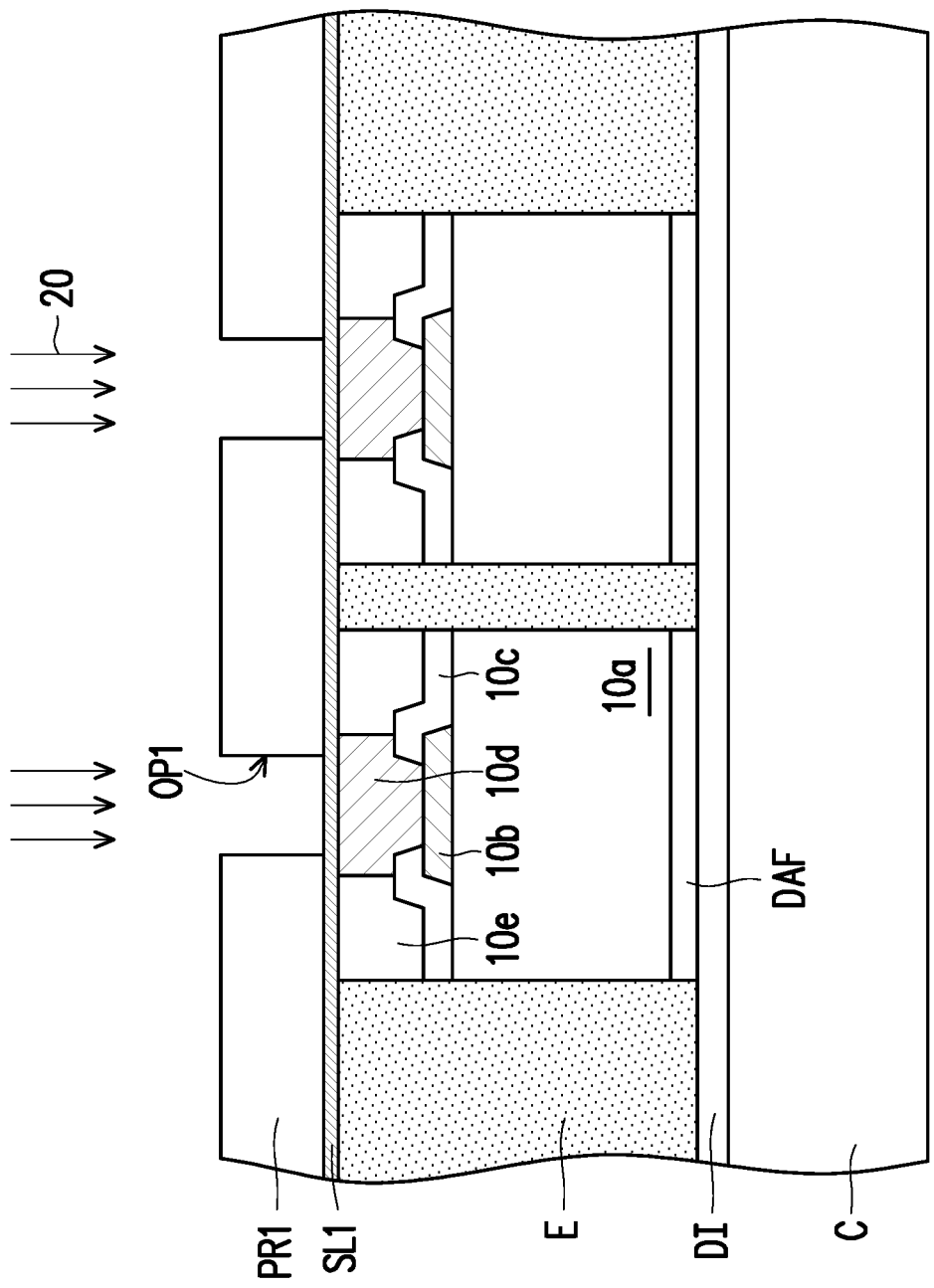
Figure 4C:
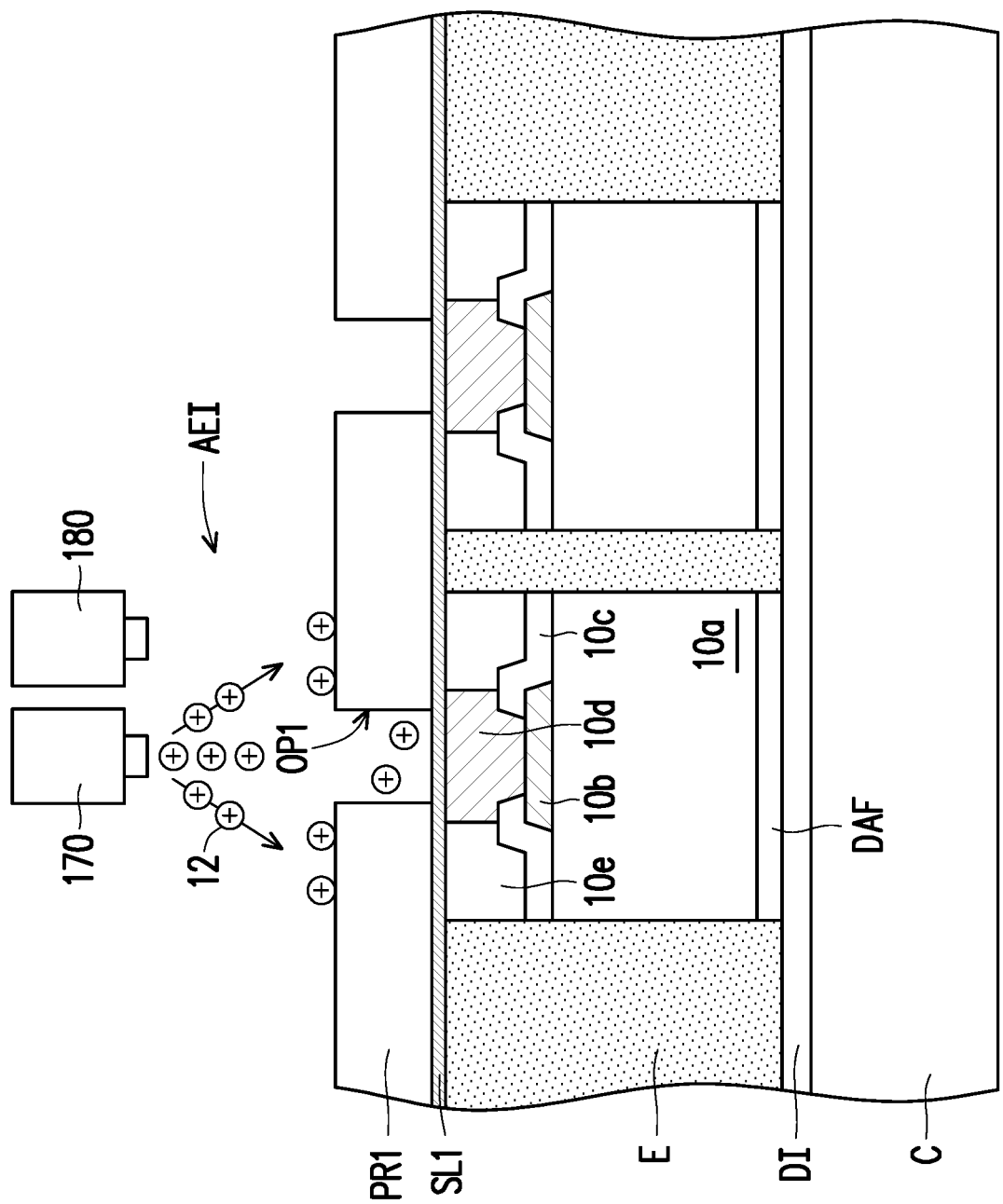
Figure 4D:
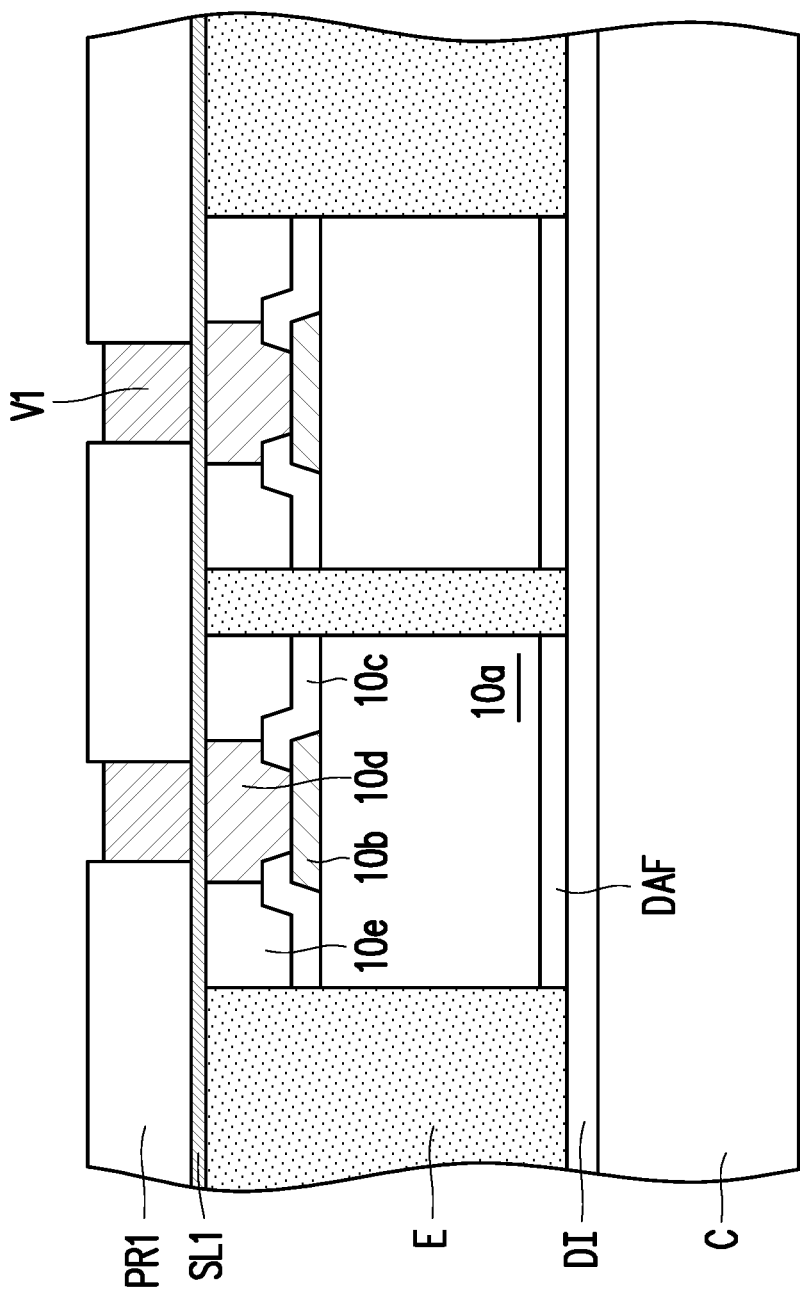
Figure 4E:
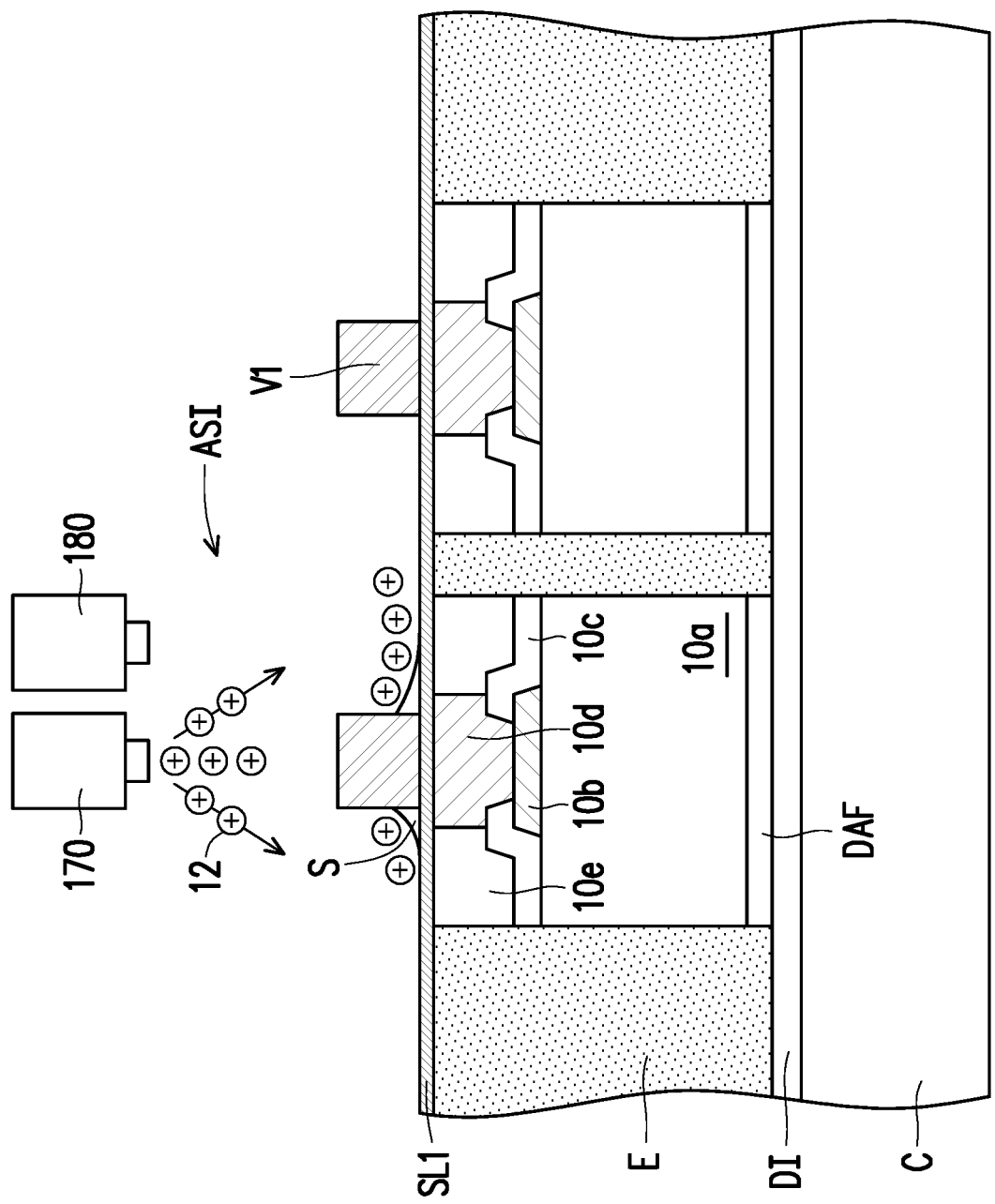
Figure 4F:
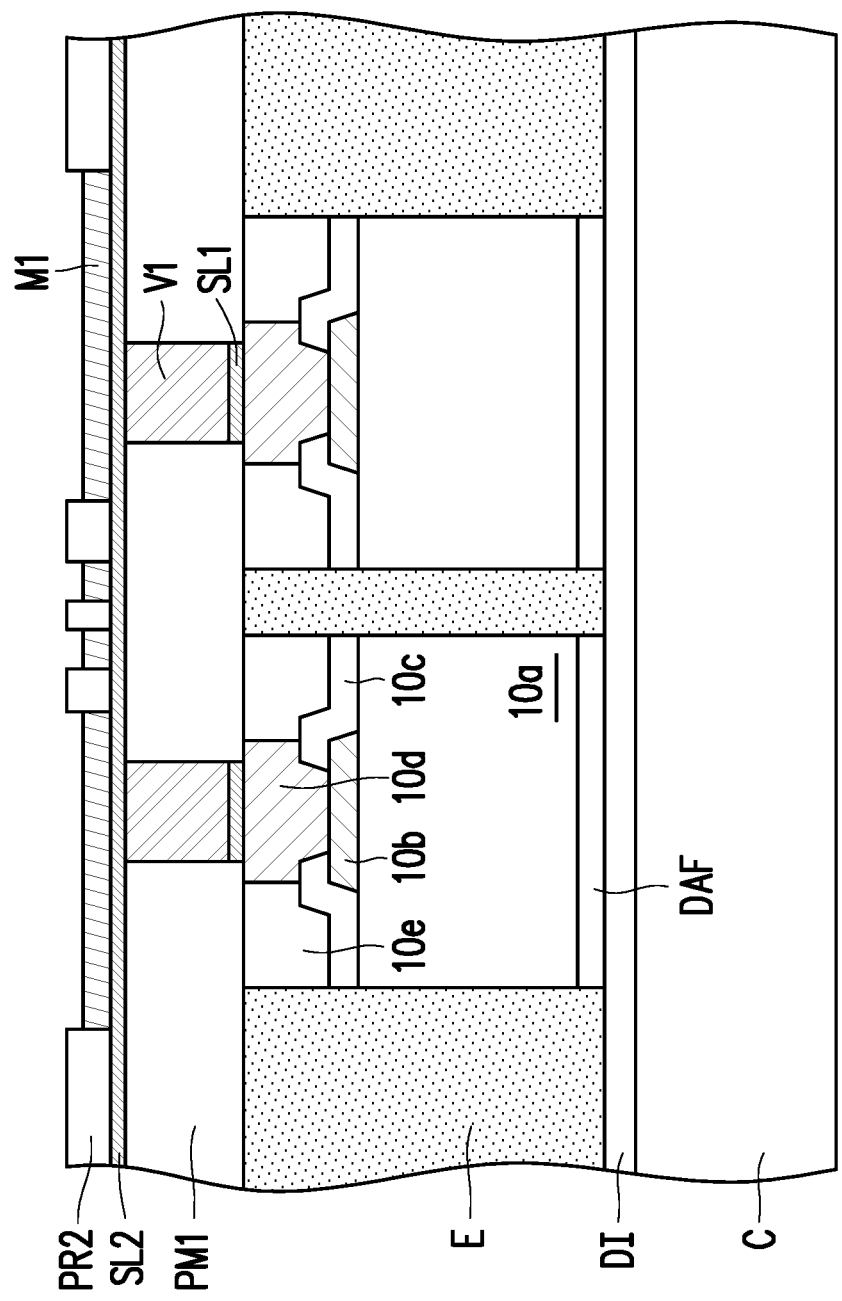
Figure 4G:
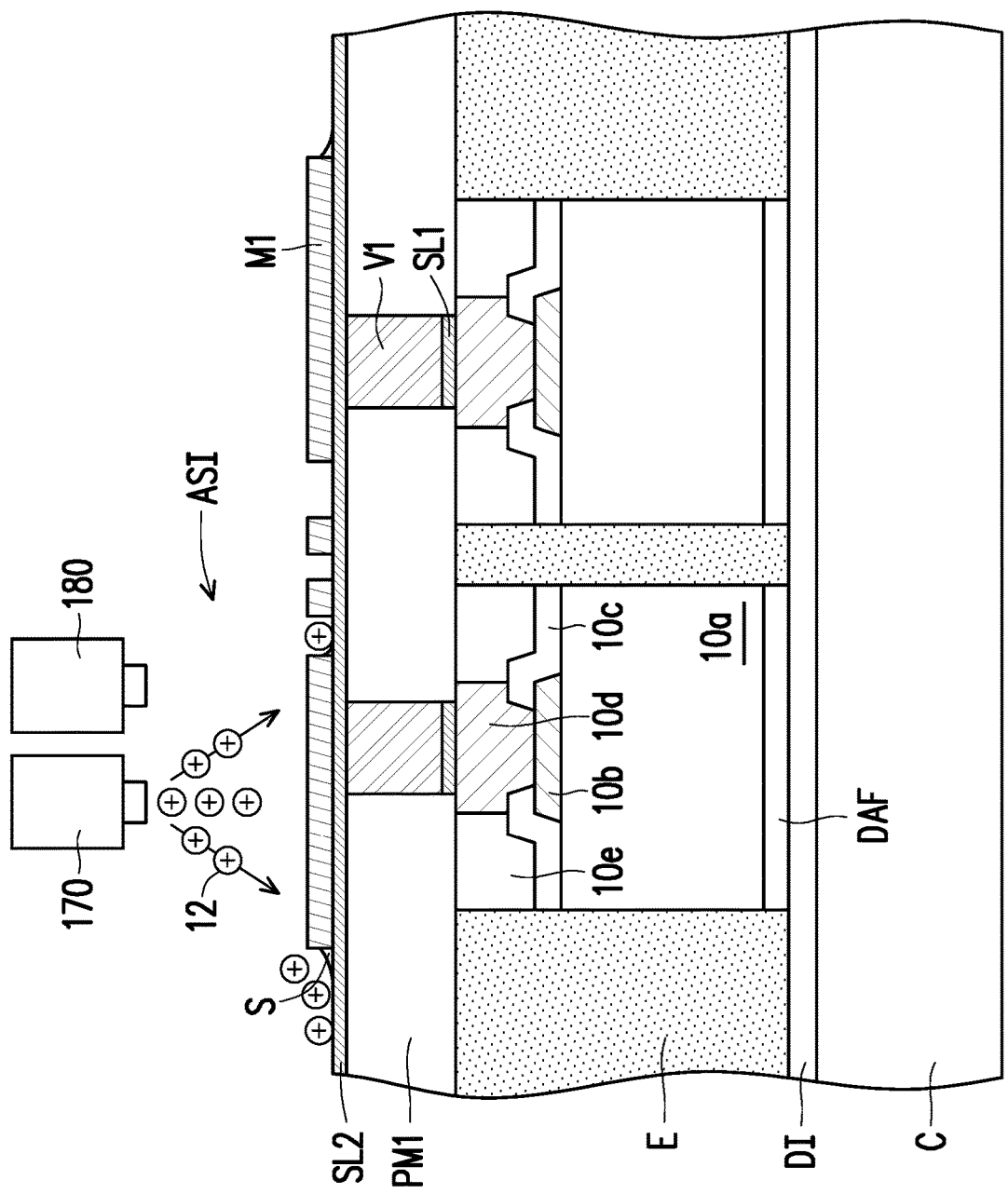
Figure 4H:
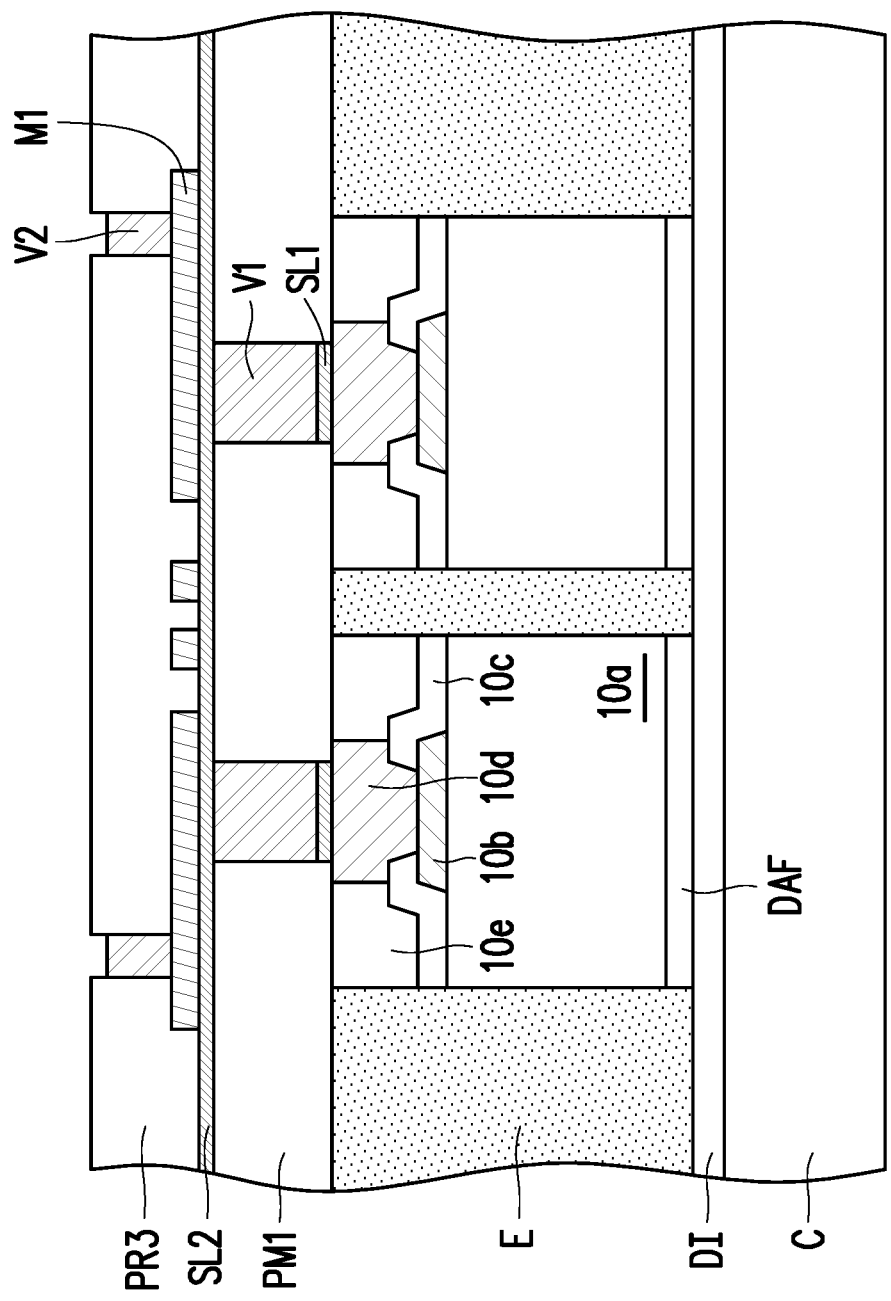
Figure 4I:
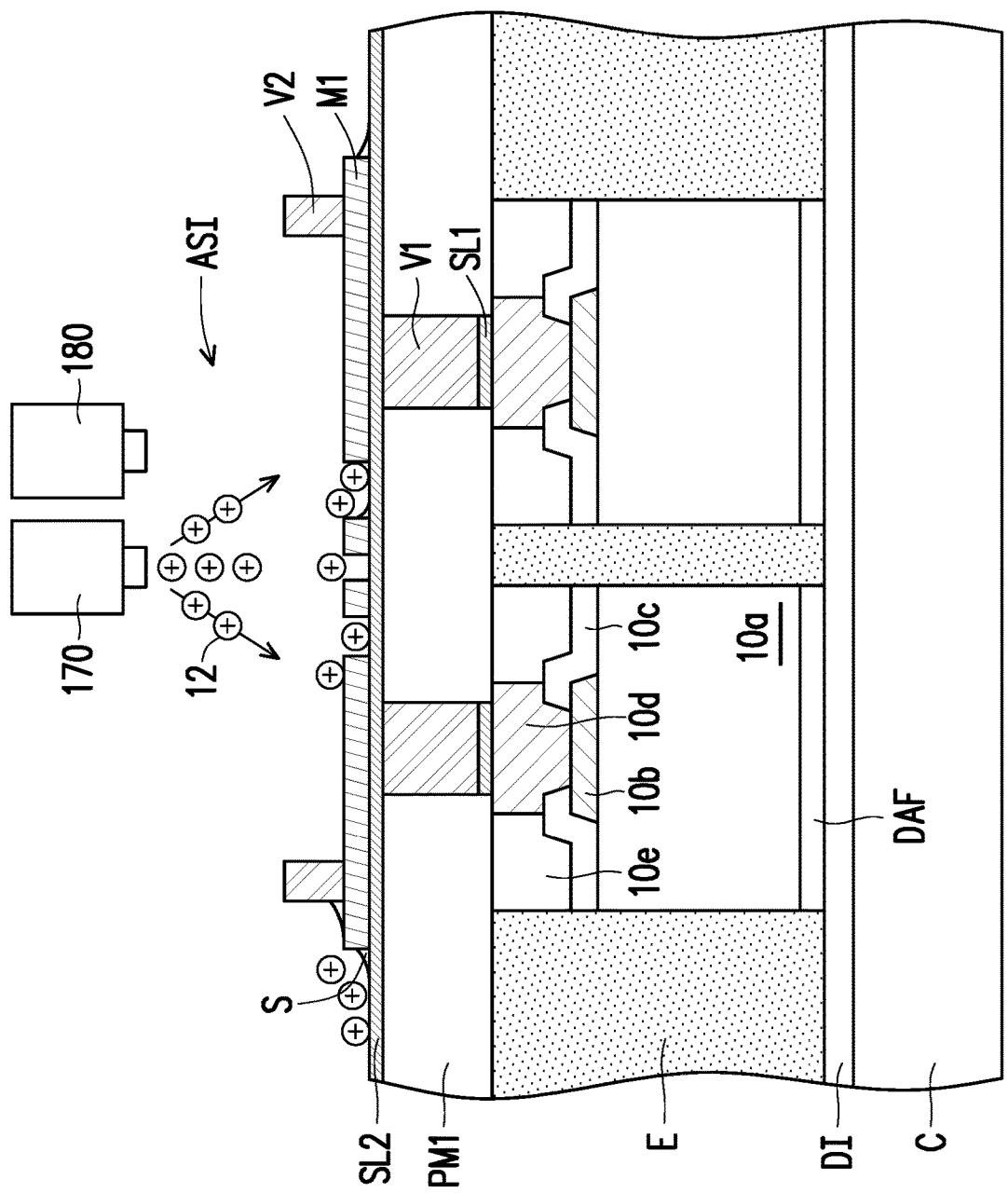

FIG. 4A to FIG. 4J are cross-sectional views showing a method of forming a semiconductor package in accordance with some embodiments. FIG. 5A to FIG. 5B show a flow chart of a method of forming a semiconductor package in accordance with some embodiments.

Figure 4J:
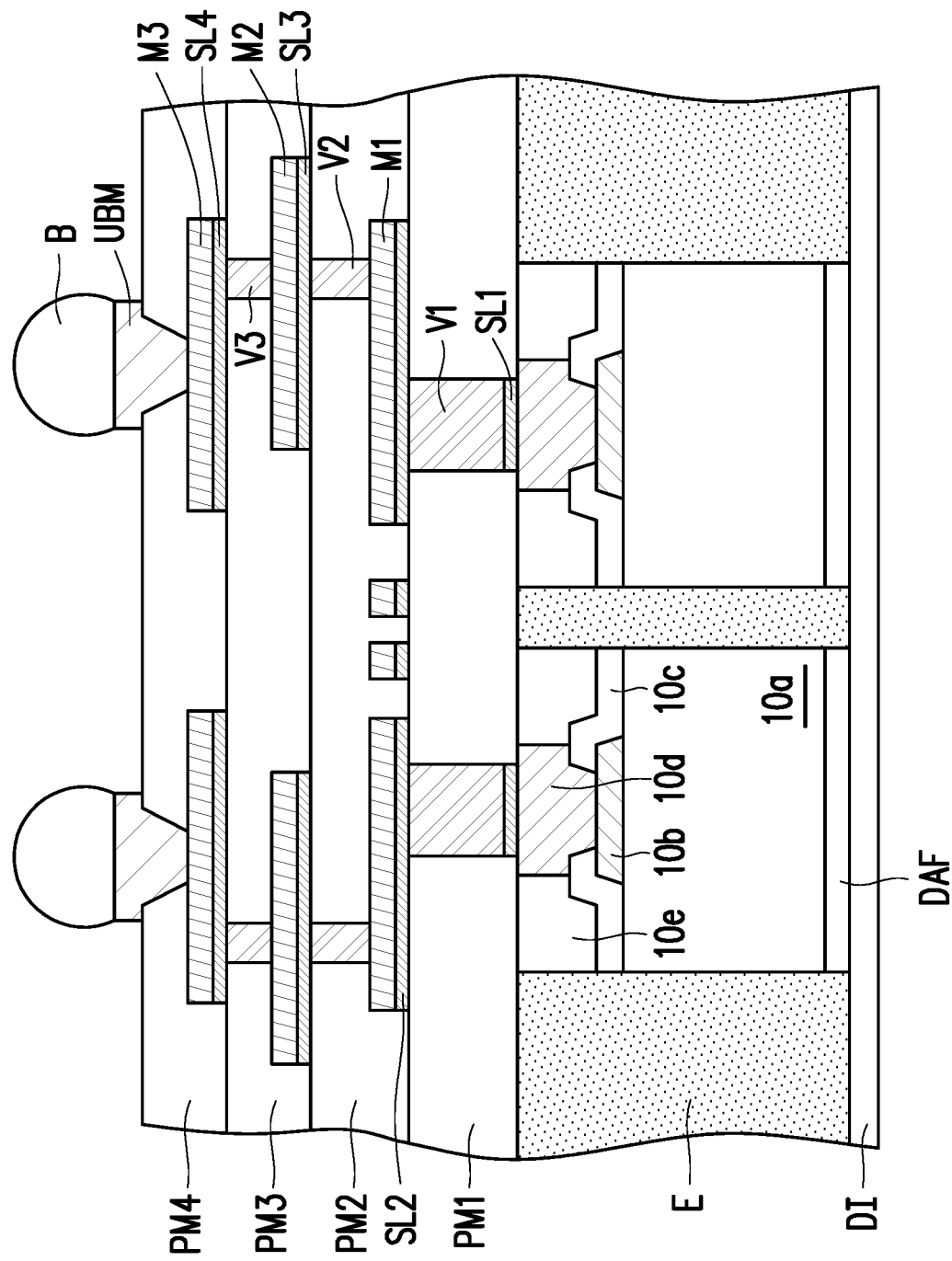
Figure 5A:
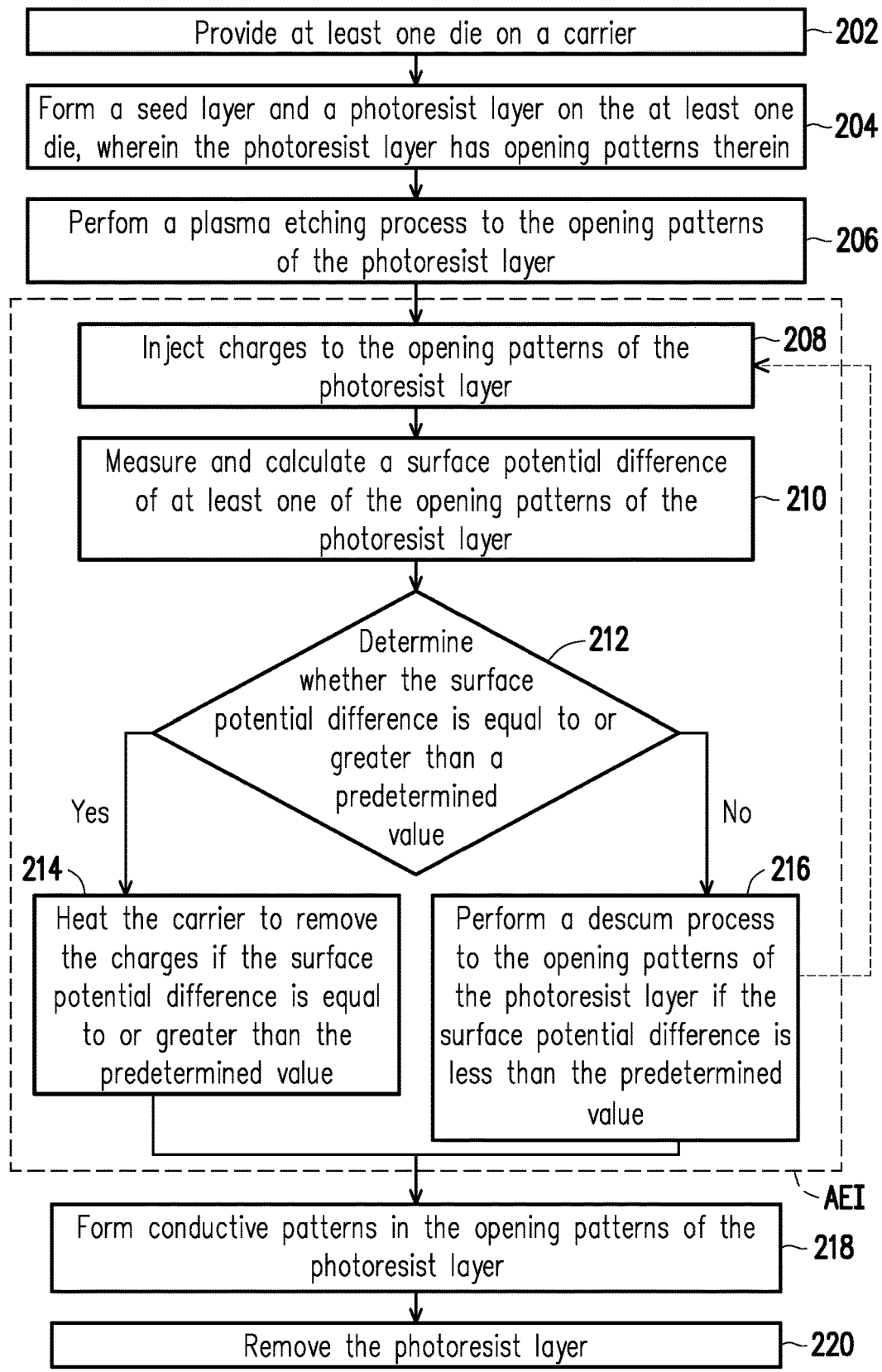
FIG. 5A to FIG. 5B illustrate a flow chart of a method of forming a semiconductor package in accordance with some embodiments.
Figure 5B:
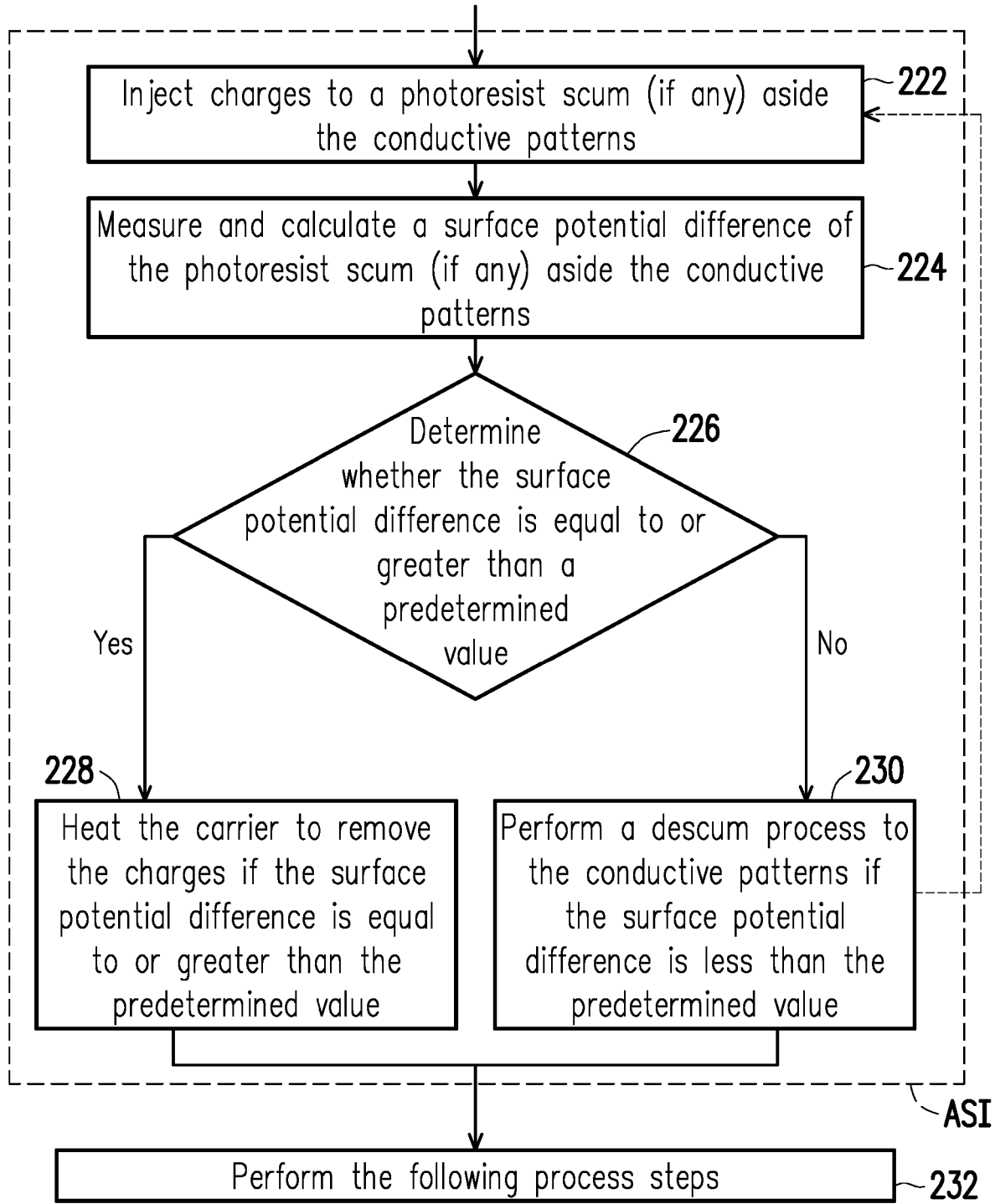

In some embodiments, the semiconductor package of FIG. 4J is an integrated fan-out (InFO) package, but the disclosure is not limited thereto. The disclosure may be applied to an integrated fan-in package as needed.

In some embodiments, the method of detecting a photoresist scum is implemented with, for example but not limited to, the photoresist scum detection apparatus 100 of FIG. 1.

Referring to FIG. 4A and FIG. 5A, in operation 202, at least one die 10 is provided on a carrier C. In some embodiments, the carrier C is a non-semiconductor carrier that may be removed from the final product. In some embodiments, the carrier C is a semiconductor wafer that may be retained in the final product. The carrier and wafer may be mutually exchangeable in various embodiments.

In some embodiments, the carrier C is provided with a dielectric layer DI formed thereon. In some embodiments, the carrier C is a non-semiconductor material, such as a glass carrier, a ceramic carrier, an organic carrier, or the like. The dielectric layer DI includes silicon oxide, silicon nitride, silicon oxynitride or a combination thereof. In some embodiments, the dielectric layer DI includes an insulating material or a polymer material.

In some embodiments, a debonding layer is provided between the at least one die 10 and the dielectric layer DI of the carrier C. In some embodiments, the debonding layer includes an Ultra-Violet (UV) glue, a Light-to-Heat Conversion (LTHC) glue, or the like, although other types of adhesives may be used. The debonding layer is decomposable under the heat of light to thereby release the carrier C from the structure formed thereon.

The die 10 may be an application-specific integrated circuit (ASIC) chip, an analog chip, a sensor chip, a wireless and radio frequency chip, a voltage regulator chip or a memory chip, for example. In some embodiments, the die 10 may include an active component or an integrated active device (IAD). In some embodiments, the adjacent dies 10 may have the same function. In alternative embodiments, the adjacent dies 10 may have different functions.

In some embodiments, each die 10 has a substrate 10a, at least one pad 10b over the substrate 10a, a passivation layer 10c over the substrate 10a, at least one connector 10d over the passivation layer 10c and electrically connected to the pad 10b, and a protection layer 10e over the passivation layer 10c and aside the connector 10d. The substrate 10a may include bulk silicon, doped or undoped, or an active layer of a semiconductor-on-insulator (SOI) substrate. The substrate 10a may have a device layer that includes a gate, source/drain regions, an interconnection structure, etc. The pad 10b may be electrically connected to the device layer and may include aluminum. Each of the passivation layer 10c and the protection layer 10e may include a dielectric material such as silicon oxide, silicon nitride or silicon oxynitirde, a polymer material such as polybenzoxazole (PBO), polyimide (PI) or benzocyclobutene (BCB), or the like. The passivation layer 10c may include a material different from that of the protection layer 10e. In some embodiment, a die attach film DAF is provided on the backside of the die 10 and attached to the debonding layer of the carrier C.

Thereafter, an encapsulation layer E is formed over the carrier C aside the at least one die 10. The encapsulation layer E surrounds the die 10, and exposes the surface of the connector 10d. The encapsulation layer E includes a molding compound such as epoxy, a photo-sensitive material such as polybenzoxazole (PBO), polyimide (PI) or benzocyclobutene (BCB), a combination thereof or the like. In some embodiments, through integrated fan-out vias (not shown) are formed through the encapsulation layer E for providing electrical connection between the die and other metal features.

Still referring to FIG. 4A and FIG. 5A, in operation 204, a seed layer SL1 and a photoresist layer PR1 are formed on the at least one die 10, wherein the photoresist layer PR1 has opening patterns OP1 therein.

Specifically, a seed layer SL1 is formed over the at least one die 10 and the encapsulation layer E. In some embodiments, the seed layer SL1 includes Ti, Ta, Cu, W, Ru, Co, Ni or an alloy thereof. In some embodiments, the seed layer SL1 includes Ti/Cu, and is formed by a sputtering process or a suitable method.

Afterwards, a photoresist layer PR1 is formed over the seed layer SL1. The photoresist layer PR1 has opening patterns OP1 that defines the intended locations for the subsequently formed vias V1. The opening pattern OP1 for each via V1 corresponds to the underlying connector 10d of the die 10.

In some embodiments, the photoresist layer PR1 is carried out in an automated track system combined with an exposure system, using a carrier (or wafer) handling equipment which transport the carriers (or wafers) between the various photolithography operation stations, such as spin coating, soft baking (SB), exposing, post exposure baking (PEB), developing and hard baking (HB) stations. In some embodiments, the photoresist layer PR1 includes a bottom antireflective coating (BARC) layer and a photosensitive layer over the BARC layer. The BARC layer may serve the function of reducing the intensity reflection coefficient of the underlying layer. In some embodiments, a photoresist scum S or residue is present in the edge corner and/or bottom of at least one of the opening patterns OP1 of the photoresist layer PR1.

Referring to FIG. 4B and FIG. 5A, in operation 206, a plasma etching process 20 is performed to the opening patterns OP1 of the photoresist layer PR1. The plasma etching process 20 is referred to a descum process in some examples. In some embodiments, the plasma gas of the plasma etching process 20 includes oxygen ($O_2$), ozone ($O_3$), nitrous oxide ($N_2O$), the like or combination thereof. The oxygen-containing plasma etching process 20 may be diluted with an inert gas, such as argon (Ar), helium (He), neon (Ne), or a mixture thereof. In some embodiments, the plasma etching process 20 removes the photoresist scum S or residue in the edge corner and/or bottom of the opening pattern OP1, and therefore exposes the underlying seed layer SL1. In some embodiments, the plasma etching process 20 removes the exposed portion of the BARC layer.

In some embodiments, a method of detecting a photoresist scum is performed after the plasma etching process of the photoresist layer PR1, and this photoresist scum inspection is referred to as after etching inspection (AEI). Such AEI can be performed with a photoresist scum apparatus of the disclosure. In some embodiments, the AEI of the disclosure includes operations 208 to 216, which will be described in details below.

The AEI is checked to make sure whether a photoresist scum S or residue within the opening patterns affects the device performance. As mentioned earlier, minimal photoresist scum which does not degrade the semiconductor device performance is acceptable. However, if a photoresist scum degrades the semiconductor device performance, a descum process is required to remove the photoresist scum.

Referring to FIG. 4C and FIG. 5A, in operation 208, charges 12 are injected to the opening patterns OP1 of the photoresist layer PR1. In some embodiments, the injecting operation is implemented by the charge injection unit 170 of the photoresist scum detection apparatus 100. In some embodiments, the charges 12 are positive charges, but the disclosure is not limited thereto. In alternative embodiments, the charges 12 are negative charges.

Thereafter, in operation 210, a surface potential difference of at least one of the opening patterns OP1 is measured and calculated. In some embodiments, the measuring and calculating operations are implemented by the surface potential detection unit 180 of the photoresist scum detection apparatus 100. In some embodiments, the measuring and calculating operations include measuring a first surface potential and a second surface potential of the at least one of the opening patterns OP1 of the photoresist layer PR1 at two different time points, and calculating a difference between the first surface potential and the second surface potential.

Afterwards, in operation 212, whether the surface potential difference is equal to or greater than a predetermined value is determined. In some embodiments, the determining operation is performed by software executed by a processor, hardware (e.g., a logic circuit), or a combination thereof. In some embodiments, a predetermined value with acceptable package performance is established, and the semiconductor package is evaluated to determine whether it is higher than, equal to or less than the predetermined value.

In some embodiments, if the surface potential difference is equal to or greater than the predetermined value, operation 214 is implemented. In operation 214, the carrier C is heated to remove the charges 12. The heating operation is implemented by the heater element 160 of the photoresist scum detection apparatus 100. In some embodiments, the heating temperature ranges from about 40° C. to 100° C., and the heating time is about 1 to 2 minutes.

In alternative embodiments, if the surface potential difference is less than the predetermined value, operation 216 is implemented. In operation 216, a descum process is performed to the opening patterns OP1 of the photoresist layer PR1. In some embodiments, the plasma gas of the descum process includes oxygen (O2), ozone (O3), nitrous oxide (N2O), the like or combination thereof. The oxygen-containing descum process may be diluted with an inert gas, such as argon (Ar), helium (He), neon (Ne), or a mixture thereof. In some embodiments, the descum process removes the photoresist scum or residue in the edge corner and/or bottom of the opening pattern OP1 that is not removed by the plasma etching process 20 in operation 206.

In some embodiments, after the descum process in operation 216, the AEI is optionally performed again to detect whether a photoresist scum is present in at least one of the opening patterns OP1. Specifically, operations 208 to 212 may be performed again after operation 216, until the surface potential difference of the at least one of the opening patterns OP1 is equal to or greater than the predetermined value.

Referring to FIG. 4D and FIG. 5A, in operation 218, conductive patterns (e.g., vias V1) are formed in the opening patterns OP1 of the photoresist layer PR1. In some embodiments, the vias V1 are plated in the opening patterns OP1 of the photoresist layer PR1 by using the seed layer SL1 as a seed. In some embodiments, the vias V1 include Ti, Ta, Cu, W, Ru, Co, Ni or an alloy thereof. In some embodiments, the vias V1 include Cu, and are formed by a plating process or a suitable method.

In some embodiments, operation 218 is performed directly after operation 214. That is, conductive patterns (e.g., vias V1) are formed in the opening patterns OP1 of the photoresist layer PR1 if the surface potential difference is equal to or greater than the predetermined value.

In alternative embodiments, operation 218 is performed directly after operation 216. That is, when the surface potential difference is less than the predetermined value, a descum process is performed to the opening patterns OP1 of the photoresist layer PR1 so as to remove the photoresist scum or residue, and then the conductive patterns (e.g., vias V1) are formed in the opening patterns OP1 of the photoresist layer PR1.

Referring to FIG. 4E and FIG. 5A, in operation 220, the photoresist layer PR1 is removed. In some embodiments, the photoresist layer PR1 is removed by a photoresist stripping process. In some embodiments, a photoresist scum S or residue is present aside the conductive patterns (e.g., vias V1).

In some embodiments, a method of detecting a photoresist scum is performed after the stripping process of the photoresist layer PRE and this photoresist scum inspection is referred to as a "after stripping inspection" (ASI) for vias V1. Such ASI can be performed with a photoresist scum apparatus of the disclosure. In some embodiments, the ASI of the disclosure includes operations 222 to 230, which will be described in details below.

The ASI is checked to make sure whether a photoresist scum S or residue aside the conductive patterns (e.g., vias V1) affects the device performance. As mentioned earlier, minimal photoresist scum which does not degrade the semiconductor device performance is acceptable. However, if a photoresist scum degrades the semiconductor device performance, a descum process is required to remove the photoresist scum.

Referring to FIG. 4E and FIG. 5B, in operation 222, charges 12 are injected to a photoresist scum S (if any) aside the conductive patterns (e.g., vias V1). In some embodiments, the injecting operation is implemented by the charge injection unit 170 of the photoresist scum detection apparatus 100. In some embodiments, the charges 12 are positive charges, but the disclosure is not limited thereto. In alternative embodiments, the charges 12 are negative charges.

Thereafter, in operation 224, a surface potential difference of the photoresist scum S (if any) aside the conductive patterns (e.g., vias V1) is measured and calculated. In some embodiments, the measuring and calculating operations are implemented by the surface potential detection unit 180 of the photoresist scum detection apparatus 100. In some embodiments, the measuring and calculating operations include measuring a first surface potential and a second surface potential of the photoresist scum S aside the conductive patterns (e.g., vias V1) at two different time points, and calculating a difference between the first surface potential and the second surface potential.

Afterwards, in operation 226, whether the surface potential difference is equal to or greater than a predetermined value is determined. In some embodiments, the determining operation is performed by software executed by a processor, hardware (e.g., a logic circuit), or a combination thereof. In some embodiments, a predetermined value with acceptable package performance is established, and the semiconductor package is evaluated to determine whether it is higher than, equal to or less than the predetermined value.

In some embodiments, if the surface potential difference is equal to or greater than the predetermined value, operation 228 is implemented. In operation 228, the carrier C is heated to remove the charges 12. The heating operation is implemented by the heater element 160 of the photoresist scum detection apparatus 100.

In alternative embodiments, if the surface potential difference is less than the predetermined value, operation 230 is implemented. In operation 230, a descum process is performed to the conductive patterns (e.g., vias V1) so as to remove the photoresist scum S (if any) aside the conductive patterns (e.g., vias V1). In some embodiments, the plasma gas of the descum process includes oxygen ($O_2$), ozone ($O_3$), nitrous oxide ($N_2O$), the like or combination thereof. The oxygen-containing descum process may be diluted with an inert gas, such as argon (Ar), helium (He), neon (Ne), or a mixture thereof. In some embodiments, the descum process removes the photoresist scum or residue in the bottom of the opening pattern OP1 that is not removed by the photoresist stripping process in operation 220.

Thereafter, in operation 232, following process steps are performed, as shown in FIG. 4F to FIG. 4J.

Referring to FIG. 4F, the seed layer SL1 is partially removed by using the vias V1 as a mask, and the remaining seed layer SL1 is between each via V1 and the corresponding connector 10d.

A polymer layer PM1 is then formed over the connector 10d and the protection layer 100e and aside the vias V1. The top surface of the polymer layer PM1 is substantially coplanar with top surfaces of the vias V1. In some embodiments, the polymer layer PM1 includes polybenzoxazole (PBO), polyimide (PI), benzocyclobutene (BCB), a combination thereof or the like.

Thereafter, a seed layer SL2 is formed on the entire surface of the polymer layer PM1 and in physical contact with the top surface of the vias V1. In some embodiments, the seed layer SL2 includes Ti, Ta, Cu, W, Ru, Co, Ni or an alloy thereof. In some embodiments, the seed layer SL1 includes Ti/Cu, and is formed by a sputtering process or a suitable method.

Afterwards, a photoresist layer PR2 is formed on the seed layer SL2. In some embodiments, the photoresist layer PR2 is formed over the polymer layer PM1 and has at least one opening that exposes the intended location for the subsequently formed metal line M1. Next, a plating process is performed to form the metal line M1 (e.g., a copper layer) in the opening of the photoresist layer PR2 by using the seed layer SL2 as a seed.

Referring to FIG. 4G, the photoresist layer PR2 is removed. In some embodiments, the photoresist layer PR2 is removed by a photoresist stripping process. In some embodiments, a photoresist scum or residue is present aside the metal line M1.

In some embodiments, a method of detecting a photoresist scum is performed after the stripping process of the photoresist layer PR2, and this photoresist scum inspection is referred to as a "after stripping inspection" (ASI) for metal line M1. Such ASI for metal line M1 is similar to the ASI for vias V1, and operations are similar to operations 222 to 230, so the details are not iterated herein.

Referring to FIG. 4H, a photoresist layer PR3 is formed on the seed layer SL2 and the metal line M1. In some embodiments, the photoresist layer PR3 is formed over the polymer layer PM1 and has opening patterns that exposes the intended locations for the subsequently formed vias V2.

Afterwards, vias V2 are formed in the opening patterns of the photoresist layer PR3. The vias V2 may include Cu. In some embodiments, a plating process is performed to form the via V2 by using the metal line M1 as a seed. The via V2 is formed directly on the metal line M1 without a seed layer (e.g., a Ti/Cu layer) therebetween.

Referring to FIG. 4I, the photoresist layer PR3 is removed by a photoresist stripping process. In some embodiments, a photoresist scum or residue is present aside the vias V2. In some embodiments, the photoresist scum or residue is also present aside the metal line M1.

In some embodiments, a method of detecting a photoresist scum is performed after the stripping process of the photoresist layer PR3, and this photoresist scum inspection is referred to as a "after stripping inspection" (ASI) for vias V2. Such ASI for vias V2 is similar to the ASI for vias V1, and operations are similar to operations 222 to 230, so the details are not iterated herein.

Referring to FIG. 4J, the seed layer SL2 is partially removed by using the metal line M1 as a mask. Therefore, the remaining seed layer SL2 is between the metal line M1 and the polymer layer PM1.

Thereafter, a polymer layer PM2 is formed over the polymer layer PM1, covering the metal line M1 and surrounding the via V2. The top surface of the polymer layer PM2 is substantially coplanar with top surface of the via V2. In some embodiments, the polymer layer PM2 covers the protruding edge of the seed layer SL2.

Afterwards, the operations similar to those in FIG. 4F to FIG. 4I are performed, so as to form a metal line M2 electrically connected to the via V2, a via V3 electrically connected to the metal line M2, a polymer layer PM3 surrounding the metal line M2 and the via V3, and a metal line M3 electrically connected to the via V2. In some embodiments, a seed layer structure SL3 is disposed between the metal line M2 and the polymer layer PM2, and a seed layer structure SL4 is disposed between the metal line M3 and the polymer layer PM3.

Next, under bump metallization pads UBM are formed over and electrically connected to the metal line M3. In some embodiments, the under bump metallization pads UBM include Ti, Ta, Cu, W, Ru, Co, Ni or an alloy thereof.

Thereafter, bumps B are formed over and electrically connected to the under bump metallization pads UBM. In some embodiments, the bumps B1 include copper, solder, nickel or a combination thereof.

Afterwards, the carrier C is de-bonded from the backside of the structure. In some embodiments, the debonding layer is decomposed under heat of light, and the carrier C is then released from the structure formed thereon. Thereafter, bumps may be formed through the dielectric layer DI and electrically connected to the through integrated fan-out vias. A semiconductor package having dual-side terminals is thus completed.

Figure 6:
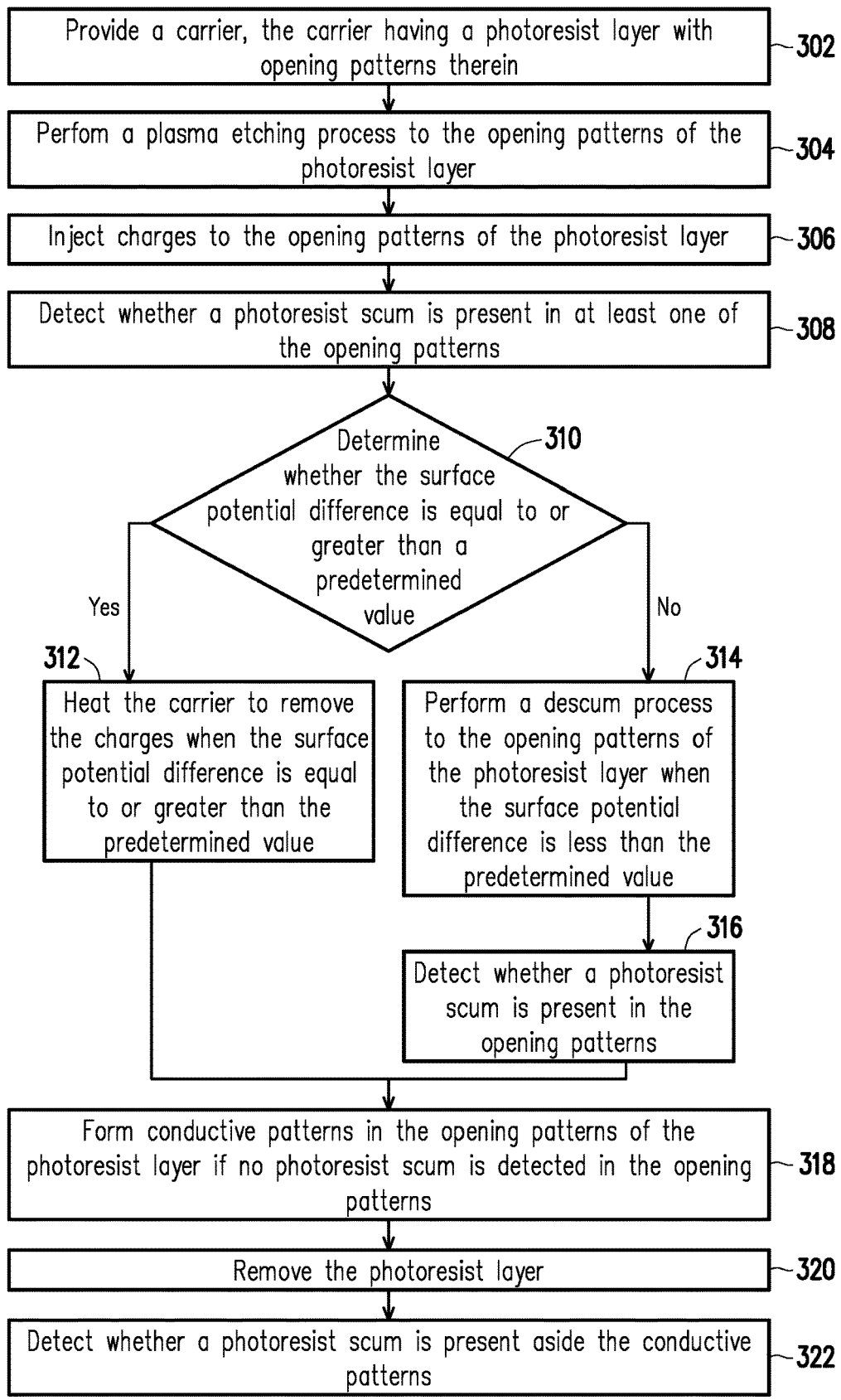
FIG. 6 illustrates a flow chart of a method of detecting a photoresist scum in accordance with some embodiments.

FIG. 6 illustrates a flow chart of a method of detecting a photoresist scum in accordance with some embodiments. Although the method is illustrated and/or described as a series of operations, acts or events, it will be appreciated that the method is not limited to the illustrated ordering or operations. Thus, in some embodiments, the operations may be carried out in different orders than illustrated, and/or may be carried out concurrently. Further, in some embodiments, the illustrated operations or events may be subdivided into multiple operations or events, which may be carried out at separate times or concurrently with other operations or sub-operations. In some embodiments, some illustrated operations or events may be omitted, and other un-illustrated operations or events may be included.

In operation 302, a carrier is provided, and the carrier has a photoresist layer with opening patterns therein. FIG. 4A illustrates a cross-sectional view corresponding to some embodiments of operation 302.

In operation 304, a plasma etching process is performed to the opening patterns of the photoresist layer. FIG. 4B illustrates a cross-sectional view corresponding to some embodiments of operation 304.

In operation 306, charges are injected to the opening patterns of the photoresist layer. In some embodiments, the charges are positive charges. In operation 308, whether a photoresist scum is present in at least one of the opening patterns is detected. In some embodiments, the detecting operation includes measuring a first surface potential and a second surface potential of the at least one of the opening patterns at two different time points, and calculating a surface potential difference of the at least one of the opening patterns. In operation 310, whether the surface potential difference is equal to or greater than a predetermined value is determined. In operation 312, the carrier is heated to remove the charges when the surface potential difference is equal to or greater than the predetermined value. In operation 314, a descum process is performed to the opening patterns of the photoresist layer when the surface potential difference is less than the predetermined value. In operation 316, whether a photoresist scum is present in the opening patterns is detected. FIG. 4C illustrates a cross-sectional view corresponding to some embodiments of operations 306 to 316.

In operation 318, conductive patterns are formed in the opening patterns of the photoresist layer if no photoresist scum is detected in the opening patterns. FIG. 4D illustrates a cross-sectional view corresponding to some embodiments of operation 318.

In operation 320, the photoresist layer is removed. FIG. 4E illustrates a cross-sectional view corresponding to some embodiments of operation 320.

In operation 322, whether a photoresist scum is present aside the conductive patterns is detected. FIG. 4E illustrates a cross-sectional view corresponding to some embodiments of operation 322.

In view of the above, in some embodiments, the method includes injecting charges to a photoresist layer, detecting whether a photoresist scum is present in the photoresist layer, and removing the charges from the photoresist layer.

With such method, a photoresist scum can be easily detected, so a descum process can be performed to remove the photoresist scum. Accordingly, the semiconductor device performance can be improved.

In accordance with some embodiments of the present disclosure, a method of detecting a photoresist scum that includes the following operations. A carrier is provided. The carrier has a photoresist layer with opening patterns therein. A plasma etching process is performed to the opening patterns of the photoresist layer. Charges are injected to the opening patterns of the photoresist layer. Whether a photoresist scum is present in at least one of the opening patterns is detected.

In accordance with alternative embodiments of the present disclosure, a method of forming a semiconductor package that includes the following operations. At least one die is provided on a carrier. A seed layer and a photoresist layer are formed on the at least one die, wherein the photoresist layer has opening patterns therein. A plasma etching process is performed to the opening patterns of the photoresist layer. Charges are injected to the opening patterns of the photoresist layer. A surface potential difference of at least one of the opening patterns is measured and calculated. Whether the surface potential difference of the at least one of the opening patterns is equal to or greater than a predetermined value is determined.

In accordance with yet alternative embodiments of the present disclosure, a photoresist scum detection apparatus includes a stage unit, a charge injection unit and a surface potential detection unit. The stage unit is configured to support a carrier, wherein the carrier has a photoresist layer with opening patterns therein. The charge injection unit is configured to inject charges to the opening patterns of the photoresist layer. The surface potential detection unit is configured to detect whether a photoresist scum is present in at least one of the opening patterns of the photoresist layer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, comprising:
   providing at least one die on a carrier;
   forming a seed layer and a photoresist layer on the at least one die, wherein the photoresist layer has opening patterns therein;
   performing a plasma etching process to the opening patterns of the photoresist layer;
   injecting charges to the opening patterns of the photoresist layer;
   measuring and calculating a surface potential difference of at least one of the opening patterns; and
   determining whether the surface potential difference of the at least one of the opening patterns is equal to or greater than a predetermined value.

2. The method of claim 1, wherein the measuring and calculating comprises measuring a first surface potential and a second surface potential of the at least one of the opening patterns at two different time points, and calculating the surface potential difference between the first surface potential and the second surface potential.

3. The method of claim 1, further comprising heating the carrier to remove the charges when the surface potential difference is equal to or greater than the predetermined value.

4. The method of claim 1, further comprising performing a descum process to the opening patterns of the photoresist layer when the surface potential difference is less than the predetermined value.

5. The method of claim 1, further comprising:
   forming conductive patterns in the opening patterns of the photoresist layer:
   removing the photoresist layer;
   injecting the charges to a photoresist scum aside the conductive patterns; and
   measuring and calculating the surface potential difference of the photoresist scum aside the conductive patterns.

6. The method of claim 1, wherein the charges are positive charges.

7. A method of forming a semiconductor package, comprising:
   providing at least one die on a carrier;
   forming a photoresist layer on the at least one die, wherein the photoresist layer has opening patterns therein;
   forming conductive patterns in the opening patterns of the photoresist layer:
   removing the photoresist layer;
   injecting charges to a photoresist scum aside the conductive patterns; and
   detecting whether the photoresist scum is present aside at least one of the conductive patterns.

8. The method of claim 7, wherein the detecting comprises:
   measuring a first surface potential and a second surface potential aside the at least one of the conductive patterns at two different time points; and
   calculating a surface potential difference of the at least one of the conductive patterns.

9. The method of claim 8, further comprising determining whether the surface potential difference is equal to or greater than a predetermined value.

10. The method of claim 9, further comprising heating the carrier to remove the charges when the surface potential difference is equal to or greater than the predetermined value.

11. The method of claim 9, further comprising performing a descum process to the conductive patterns when the surface potential difference is less than the predetermined value.

12. The method of claim 7, wherein the charges are positive charges.

\* \* \* \* \*